United States Patent
Jones et al.

(10) Patent No.: US 6,828,911 B2
(45) Date of Patent: Dec. 7, 2004

(54) LIGHTNING DETECTION AND PREDICTION ALARM DEVICE

(76) Inventors: David E. Jones, 2488 Coronet Ct., Spring Hill, FL (US) 34609; Berkley C. Badger, 324 Westgate Rd., Taylor Springs, FL (US) 34688

(*) Notice: Subject to any disclaimer, the term of this patent is extended or adjusted under 35 U.S.C. 154(b) by 41 days.

(21) Appl. No.: 10/391,608

(22) Filed: Mar. 20, 2003

(65) Prior Publication Data
US 2004/0183686 A1 Sep. 23, 2004

(51) Int. Cl.[7] .................................................. G01W 1/00
(52) U.S. Cl. .................. 340/601; 340/539.28; 340/602; 324/457; 702/4
(58) Field of Search ................................ 340/601, 602, 340/539.28; 324/72, 457–465; 702/4

(56) References Cited

U.S. PATENT DOCUMENTS

| | | | |
|---|---|---|---|
| 3,753,117 A | * 8/1973 | Downing et al. | 73/170.24 |
| 4,056,772 A | * 11/1977 | Graf von Berckheim | 324/72 |
| 5,296,842 A | * 3/1994 | Kato | 340/601 |
| 5,521,603 A | * 5/1996 | Young | 342/198 |
| 5,699,245 A | 12/1997 | Herold | 702/4 |
| 5,771,020 A | 6/1998 | Markson et al. | 342/460 |
| 5,977,762 A | * 11/1999 | Murtha et al. | 324/72 |
| 6,038,118 A | * 3/2000 | Guerra | 361/111 |
| 6,061,216 A | 5/2000 | Fuqua | 361/1 |
| 6,246,367 B1 | 6/2001 | Markson et al. | 342/460 |
| 6,405,134 B1 | 6/2002 | Smith et al. | 702/4 |

* cited by examiner

*Primary Examiner*—Daniel J. Wu
*Assistant Examiner*—Son Tang
(74) *Attorney, Agent, or Firm*—Siemens Patent Services, LLP

(57) ABSTRACT

The present invention features a system and method for detecting and predicting lightning strikes via specialized electrostatic detection using highly sensitive atmospheric static electric detection, interpretation, and alarm signal distribution. The system employs a detection means which includes a designated lightning sensor having a surface which carries a high impedance static voltage reference charge. This reference charge, called the pilot voltage, is a static charge delivered to the lightning sensor at very low currents. The pilot voltage influences the relative charge in the molecules found in the atmosphere immediately surrounding the lightning sensor. There is a gradual transition in the charge between the lightning sensor's surface and the molecules in the atmosphere that surrounds the sensor. It is this varying molecular state that creates a modulation process which the present invention uses to determine a lighting strike.

20 Claims, 5 Drawing Sheets

LIGHTNING DETECTION AND PREDICTION ALARM DEVICE

BACKGROUND OF THE INVENTION

1. Field of the Invention

The present invention relates to electrical detector circuitry, and more particularly, to an apparatus for detecting lightning.

2. Discussion of the Prior Art

The prior art is replete with devices that attempt accurate detection of lightning in the atmosphere. For example, the U.S. Patent to Murtha, Jr., et al., issued Nov. 2, 1999, (U.S. Pat. No. 6,061,216) for a Lightning Detection Apparatus and Methodology makes use of an antenna and amplifier configuration for receiving electrostatic discharges of lightning and electrical noise to output an analog electrical signal representative of the discharge. This analog signal is applied to a threshold detection circuit whose output is activated when the input signal rises above a predetermined level. Herein a computer or similar device examines the output to determine an open event window. It is the pulses of the event window that are given signatures which are compared. If the pulse signature correlates with that of lightning, then an alert signal is generated.

The U.S. Patent to Fuqua, III, U.S. Pat. No. 6,061,216, issued May 9, 2000, teaches of the protection of electrical or electronic equipment from lightning. The device detects amplitude modulation RF signals emitted from an electrical storm, via a detector which sends energy to signal a trigger relay to activate an internal timer and relay systems to disconnect the device, thereby protecting it from lightning damage.

In U.S. Pat. No. 6,246,367, to Markson, et al., for a Lightning Locating System, a device is disclosed that detects the initial discharge of the leader stroke of a lightning flash. Sensors are employed that use time difference of arrival information to determine the range of an initial lightning discharge.

The U.S. Patent to Guerra (U.S. Pat. No. 6,038,118) issued Mar. 14, 2000, is for a Lightning Protector System. A radio frequency detector assembly, which receives input from an antenna and a line sensor, senses signatures of electrical environmental events, such as lightning strikes and transient line events caused by power grid loss, etc. This protector circuit uses a central processing unit (CPU) to isolate the equipment from the volatile power grid and switches the power source to a local storage cell device.

The U.S. Patent to Young (U.S. Pat. No. 5,923,516) issued Jul. 13, 1999, is for an Apparatus for Protecting Electrical and Electronic Equipment and Associated Method. Herein, another protection apparatus is disclosed which includes a device that is switchable between a protected state and an operating site. The apparatus protects the electrical equipment form disturbances carried by the external electrical conductors.

The Distributed Lightning Detection System disclosed in U.S. Pat. No. 5,699,245, to George issued on Dec. 16, 1997, teaches of a plurality of lightning detection stations located at different positions with respect to a common frame of reference, with the position of at least one detection station being mobile. Each station includes a lightning strike detector, first and second receivers, a processor, and a transmitter. The receivers are adapted to receive signals from the GPS system for establishing a common lightning position and occurrence time from a point of reference for all stations. The transmitter reports strikes over a data link to other lightning detectors and provides this data to the central processor. The processor correlates received strike reports with detected strike reports to determine reports generated from common lightning strikes and computes a range from the station to each of the common lightning strikes based on the data of the correlated strike reports corresponding thereto.

The disclosed Incipient Lightning Detection and Device Protection device of Young, U.S. Pat. No. 5,521,603, issued May 28, 1996, teaches of an apparatus that continuously and automatically protects electrical devices from potential threats of damaging voltage levels. This apparatus employs the use of a detector for detecting a threat, and a protection switching circuit for grounding the electrical device and the detector upon detection.

Smith et al., disclose a Method and Apparatus for Predicting Lightning Threats Based on Radar and Temperature Data, patented on Jun. 11, 2002 as U.S. Pat. No. 6,405,134, teaching of a system for predicting areas where lightning strikes are likely to occur by evaluating radar and temperature data. Radar volume data is analyzed to locate cloud tops that extend above a height corresponding to a particular temperature line. Areas where cloud tops extend above the height of −10 degrees C and that have a radar composite reflectivity greater than 30 bDZ are designated as probable lightning threat areas. Radar movement is tracked across at least two time periods and a correlation algorithm predicts the future location of lighting threat areas at predetermined time periods based on predicted radar values. Then, a computer display shows predicted locations where lightning damage is likely to occur.

None of these patents either teaches or suggests the detection of molecular changes in the atmosphere using a plate sensor carrying a static, pilot voltage with a high impedance to determine the probability of a lightning strike or determines a prediction of local lightning activity within a one-half mile range.

SUMMARY OF THE INVENTION

The present invention features a system and method for detecting and predicting lightning strikes via specialized electrostatic detection using highly sensitive atmospheric static electric detection, interpretation, and alarm signal distribution. The system employs a detection means which includes a designated lightning sensor having a surface which carries a high impedance static voltage reference charge. This reference charge, called the pilot voltage, is a static charge delivered to the lightning sensor at very low currents. The pilot voltage influences the relative charge in the molecules found in the atmosphere immediately surrounding the lightning sensor. There is a gradual transition in the charge between the lightning sensor's surface and the molecules in the atmosphere that surrounds the sensor. It is this varying molecular state that creates a modulation process which the present invention uses to determine a lighting strike within a one-half mile radius. The actual static voltage on the lightning sensor's plate surface will be brought back to the original set pilot voltage value as prescribed by software and hardware settings of the system.

It is therefore an object of the invention to provide a system and method for detecting and predicting lightning strikes.

It is another object of the invention to provide a
a system and method for accurately predicting lightning strikes for at least a one-half mile radius.

It is also an object of the invention to provide a system for detecting lighting strikes by detecting atmospheric changes on an electro-molecular level for efficiently detecting lighting strikes.

It is a further object of the invention to provide a method and system for accurate lightning strike detection and prediction with a two-level alarm system for notification to avoid disasters.

It is an additional object of the invention to provide a system and method that overcomes very short alarm indication problems by sensing the actual lightning conditions for a local lightning strike.

These and other objects, features and advantages will be more apparent from a study of the enclosed text and the appended drawings.

BRIEF DESCRIPTION OF THE DRAWINGS

A complete understanding of the present invention may be obtained by reference to the accompanying drawings, when taken in conjunction with the detail description thereof and in which.

DESCRIPTION OF THE PREFERRED EMBODIMENT

This disclosure of the invention is submitted in furtherance of the constitutional purposes of the U.S. Patent Laws "to promote the progress of science and useful arts" (Article 1, Section 8).

Figure 1:
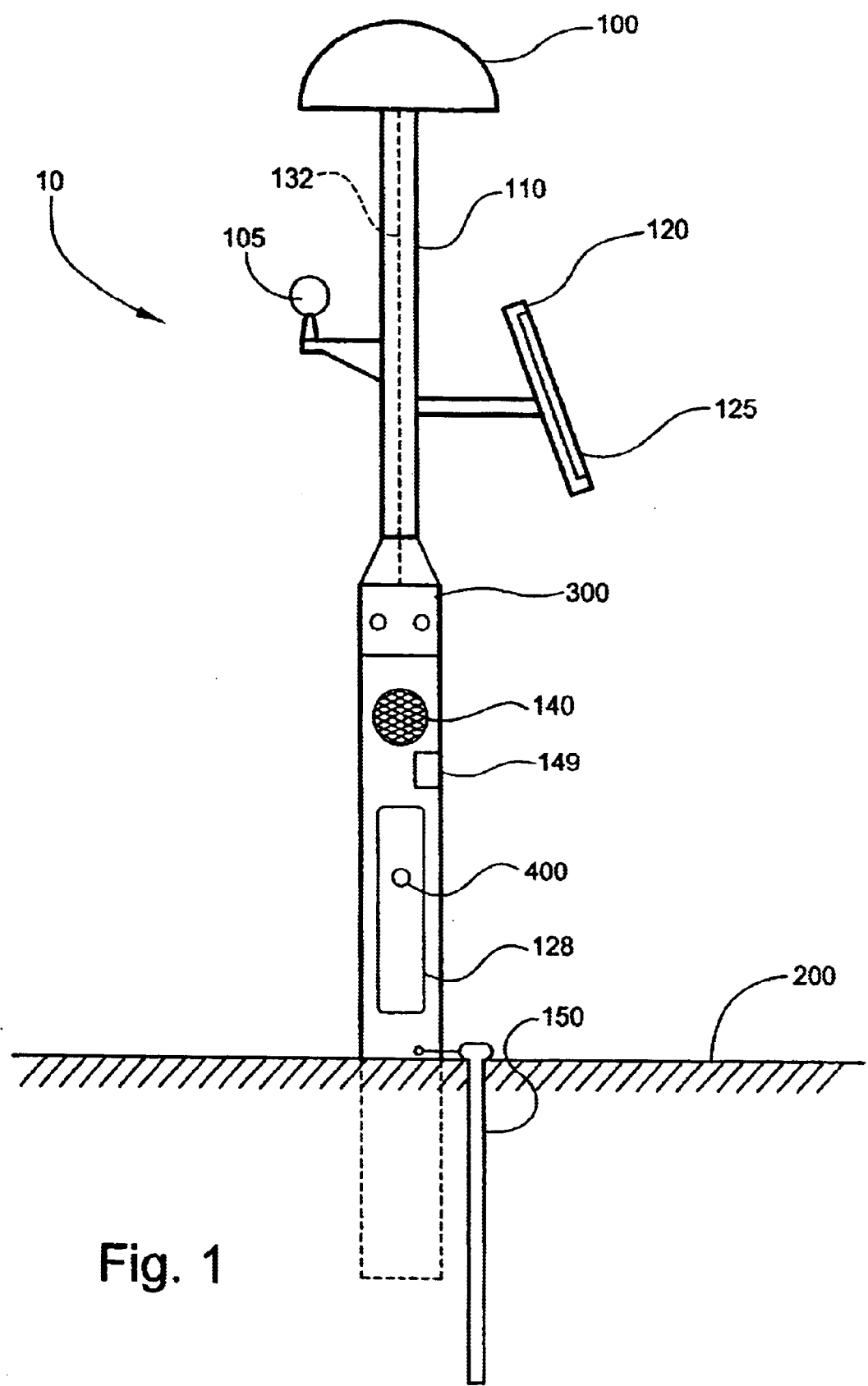
FIG. 1 is an environmental perspective of the lightning prediction and alarm device.

Generally speaking this invention relates to a lightning detection and prediction alarm device 10 (LDPAD) as shown in FIG. 1. During an electrical storm, the electrical dynamics of the atmosphere become unsettled and turbulent. The normal average static charge in the air begins to swing to more negative and positive potentials. Lightning creates a shock wave effect on the average static charge in the atmosphere's relative electric state, creating a static voltage spike. These spikes trigger the LDPAD 10 to send a lightning detection alarm signally.

Rapid changes in the charge in the atmosphere are a result of local discharges of lightning bolts in a more rapid positive to negative charge swings relative to the ground. This rapid change is detected by the sensor electronics 300 which in turn send a lightning detection alarm signal by a strobe light 105. In a preferred embodiment, the strobe light 105 is used to indicate the presence of lightning nearby and the audible horn 140 is used if conditions warrant a lightning prediction. A rapid change in the negative charge level in the atmosphere indicates a lightning prediction audible alarm signal via audible horn 140.

The LPDAD 10 is located outdoors, embedded in the earth's surface 200. The LPDAD 10 is supported by an external housing support 110. Located atop of housing 110 is the Ion Charge Plate Sensor (ICPS) 100, which is used to sense the electrical activity in the atmosphere. The LPDAD 10 is preferably located away from trees, buildings and other objects to maximize sensitivity of the ICPS 100 being able to sense very faint and natural static electrical charges contained in the molecules of the atmosphere. The atmosphere's static charge level is constantly changing the static charge on the ICPS's 100 surface.

The natural static charge level contained in the immediate atmosphere surrounding the ICPS 100 may be affected by the relative humidity, temperature, the sun, the lack of sunlight, local electrical noise generated by electrical power, humans and animals walking by, and other natural phenomena.

An insulated coaxial cable 132 supplies the plate sensor 100 with the static pilot voltage. Coaxial cable 132 also electrically couples the plate sensor 100 with the sensor electronic circuitry 300 (discussed in detail below). A weatherproof housing support 110 is used as the structural support for the system 10.

Figure 2:
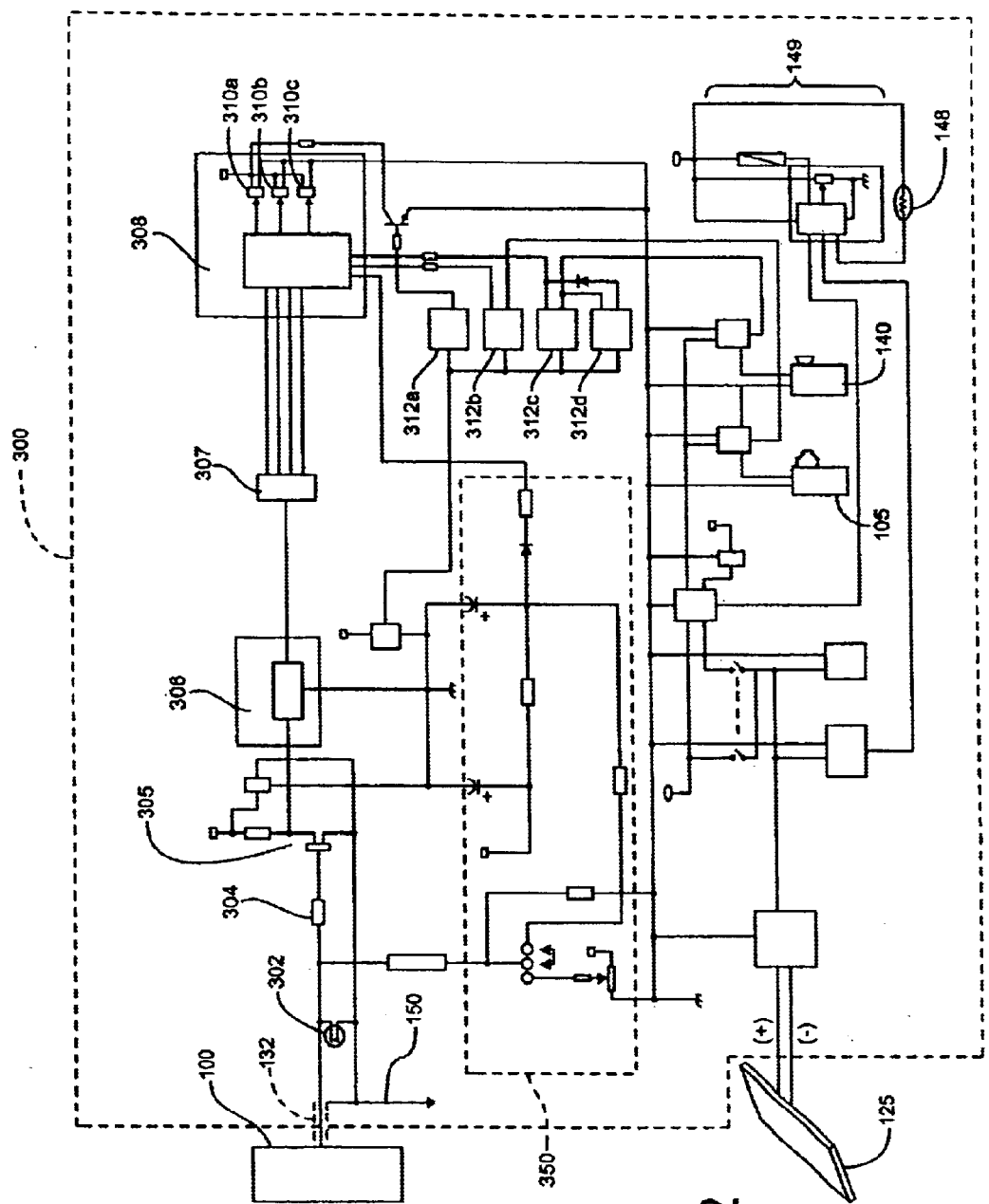
FIG. 2 is a schematic diagram showing an embodiment of the sensor electronics in accordance with the present invention.
Figure 3:
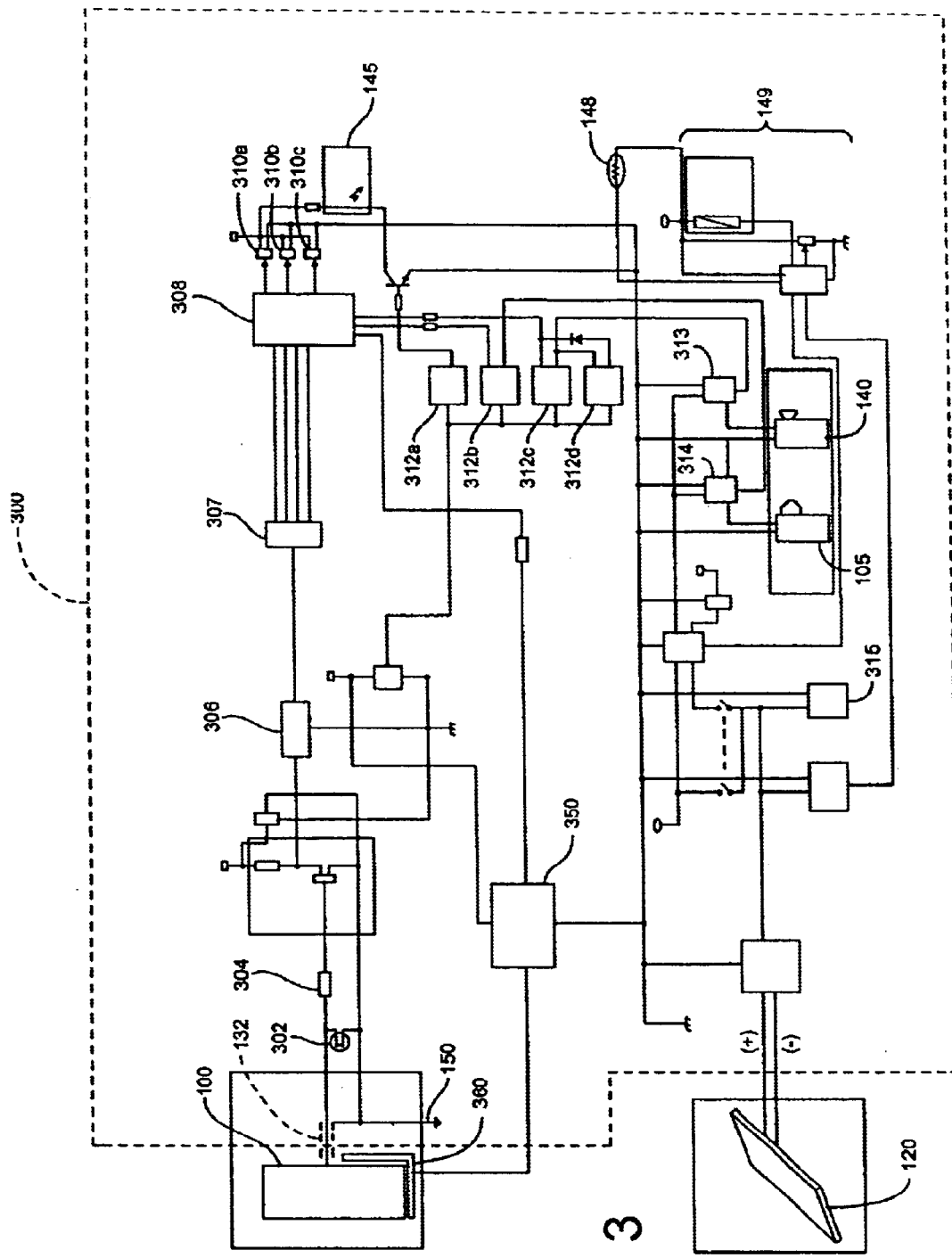
FIG. 3 is a schematic diagram showing an alternate embodiment of the sensor electronics wherein capacitive coupling is employed, in accordance with the present invention.
Figure 4:
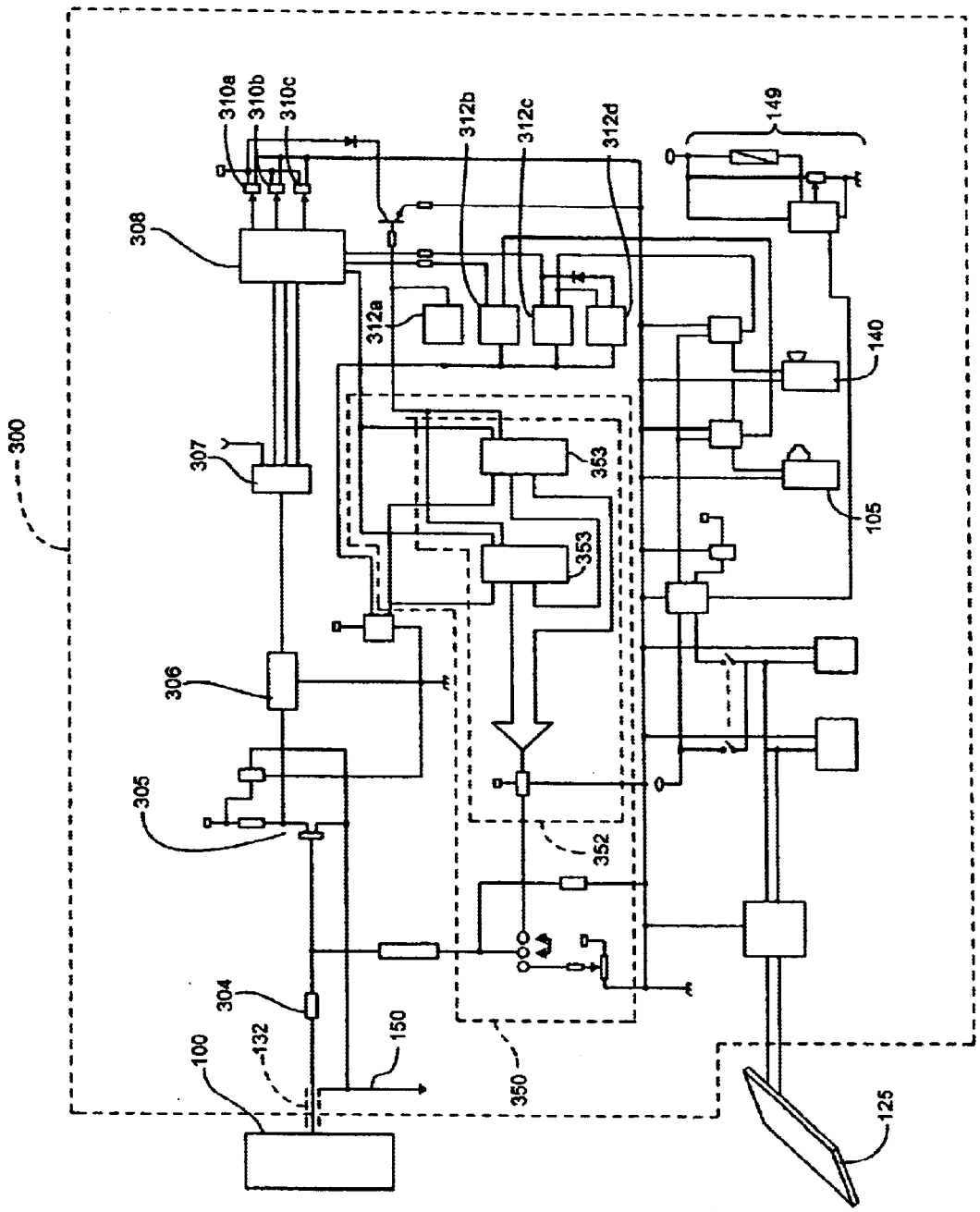
FIG. 4 is a schematic diagram showing an alternate embodiment of the sensor electronics wherein digital to analog conversion means are employed, in accordance with the present invention.
Figure 5:
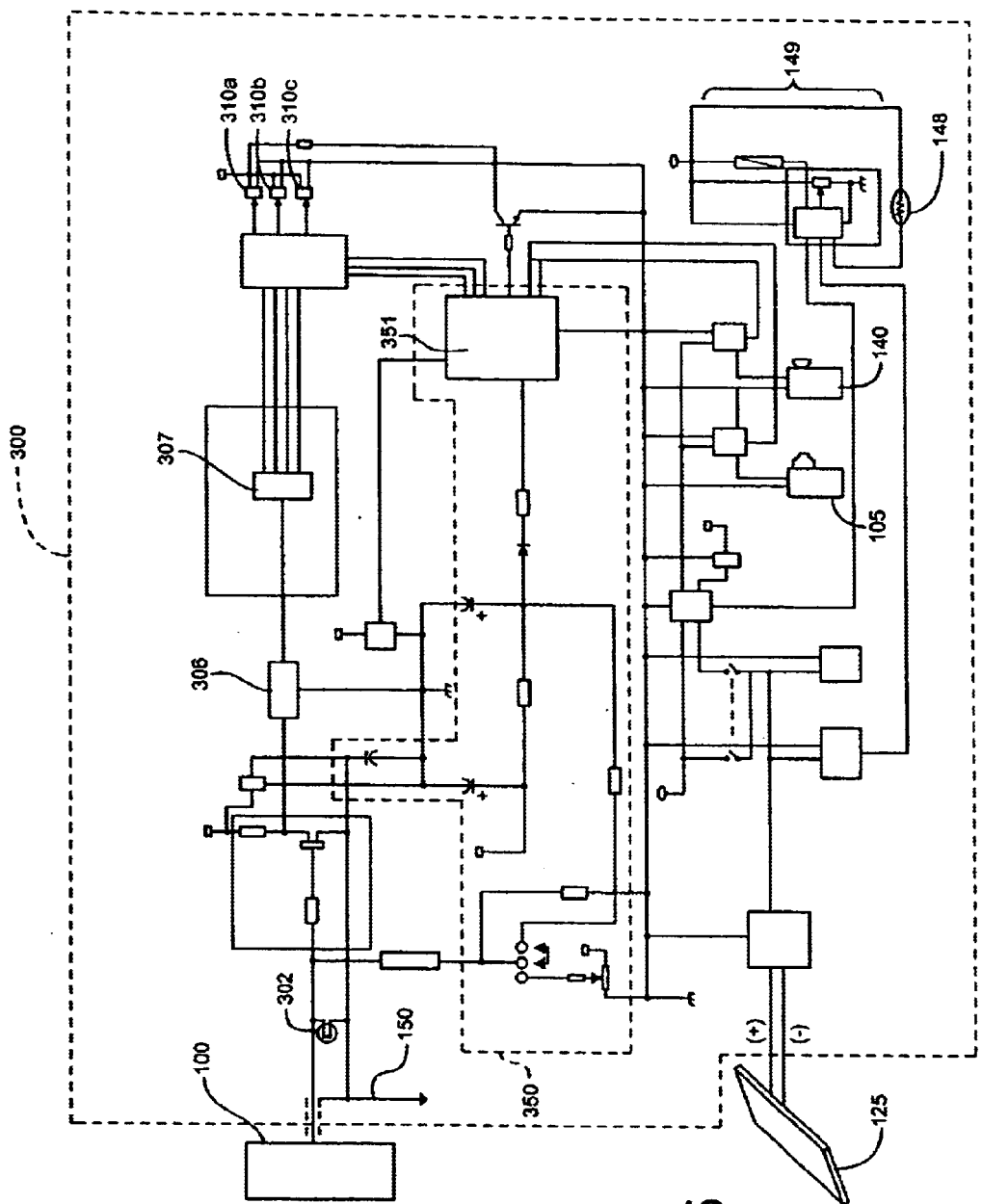
FIG. 5 is a schematic diagram showing an alternate embodiment of the sensor electronics wherein a microcontroller is employed, in accordance with the present invention.

FIGS. 2–5 are schematic diagrams further illustrating the electronic components of the LPDAD 10. The ICSP 100 may be coupled to the sensor electronics 300 by either capacitive coupling or resistive coupling. FIG. 2 shows an embodiment of resistive coupling between the ICPS 100 and the sensor electronics 300. Alternatively, FIG. 3 shows an embodiment wherein ICPS 100 is capacitive coupled. Although FIGS. 4 and 5 illustrate resistive coupling, it may be appreciated by those of ordinary skill in the art that capacitive coupling (as in the FIG. 3 embodiment) may be likewise employed.

Since it is known that the natural atmosphere can be more positively or negatively charged at any time, it is of utmost importance to stabilize the circuit relative to the pilot voltage applied to the ICPS 100. For example, after sunset, in the summer local atmospheric static electricity assumes a more positive charge as negative ions decrease. This local atmospheric static electricity also changes due to season and climatic changes. This stabilization is performed by a very high mega ohm resistor. The shape of the ICPS 100 allows the circuitry of the sensor electronics 300 to be as immune to RF frequencies as possible, thereby picking up on the electrostatic component of electrical activity.

The circuitry of the sensor electronics 300 allows for constant and slow achievement of equilibrium, wherein equilibrium is defined around the value of the pilot voltage. The sensor electronics circuitry 300 allows for the rejection of unwanted signals by filtering them out. The ICPS's 100 actual surface electrical static charge level is the product resulting from the ICPS 100 regulated static charge level maintained by the pilot voltage in conjunction with the static charge level of the ICPS's 100 surface.

In the presence of an electric storm, a negative, static charge signature is produced. This change is characterized by an increasing, stepped ladder of electricity. This negative, static electrical charge signature is detected via the Static Charge Level Logic Control (SCLLC) 350. The PILOT VOLTAGE CONTROL CIRCUITRY 350 automatically controls the pilot voltage level changes to slowly maintain this nominal static voltage value (equilibrium) in response to the ongoing gradual changing normal ion average electrical level which occurs from day to night and from season to season.

These gradually changing ion electrical values do not represent electrical turbulence characteristic of lightning. It is this nominal, equilibrium value that the PILOT VOLTAGE CONTROL CIRCUITRY 350 regulates. The ion atmospheric charge potential is collected on the ICPS's 100 metal surface and either this ion charge adds to or subtracts form the normal charge bias which is applied to the charged ICPS 100. Rapid changes in the ICPS 100 bias level indicates the presence of electrical turbulence in the vicinity of the LPDAD 10. This nominal charge bias is supplied by the coaxial cable 132 via the sensor circuitry 300 and not the ICPS 100.

These changes are amplified using an N-channel FET device, or other amplifier device. In the preferred embodiment of this invention, the changes are amplified by a very high impedance MOSFET transistor 305. MOSFET 305 greatly amplifies the charge potential located on the ICPS 100 in order to expand the variations in voltage potential electrically and to supply these voltages to the comparator.

The nominal pilot voltage level across the MOSFET's 305 drain D is maintained to develop a drain voltage at a desired level. In some embodiments, this level may be in the range of 1–8 volts, with respect to the earth's ground, however this value may vary greatly depending on the model specifications. The source voltage potential S of the FET 305 is of a specific value above the ICPS's 100 common ground (not shown) which is not the earth's common ground 150. The FET's 305 source S is grounded to the Earth's ground 150 to use as a stable reference. Furthermore, the MOSFET's 305 gate node is buffered by a gas lamp 302 which serves as in a transient protector and a high voltage short-switch. The gas lamp 302 may be a neon gas lamp.

In operation, if the voltage appearing at the FET's 305 drain D becomes more positive, relative to a desired voltage, the ICPS 100 has become more negatively charged due to the interaction of more negatively charged ions from the atmosphere surrounding the LPDAD 10. If the voltage appearing at the FET's drain becomes more negative, relative to a desired voltage, the ICPS 100 has become more positively charged due to the interaction of more positively charged ions from the atmosphere surrounding the LPDAD 10.

The electrical signature of lightning would result in quick, positive leading, increasing voltage spikes appearing on the FET's 305 gain G followed immediately by a negative spike. This rapid more positive voltage on the FET's 305 gate G causes an amplified, much lower impedance signal in reverse (more negative) to appear at the FET's 305 drain D, which is then processed for alarm monitoring. This electrical atmospheric signature indicates a lightning discharge detection.

A rapid increase of more positive voltage across the FET's 305 drain D indicates a much higher level of negatively charged ions surrounding the ICPS 100, which is transferred to the FET's 305 gate G. This electrical atmospheric signature indicates a very highly charged cloud in the vicinity.

Both a rapid negative voltage spike along with a more generally positive voltage appearing on the FET's 305 drain D, is representative of an electrical atmospheric signature indicative of the two conditions indicating lightning activity. This signature indicates both a high electrical turbulence activity in the clouds in the nearby vicinity and its highly charged state, signifying the danger of the high possibility of a local lightning strike.

Local lightning strikes are more of an AC-induced voltage type of electricity, while the presence of a pending lightning strike is more of a negative DC voltage charge. Hence, a notch filter 306 filters out any AC and RF interferences traversing the sensor circuitry 300. The amplified filtered signals are divided into resistive and capacitive components by R/C Delay 307 and distributed to the inputs of an analog quad IC comparator 308.

The comparator 308 compares the real-time changes of the pilot voltage levels to a stable reference in order to increase the amount of electrical turbulence being received by the ICPS 100. The sensor circuitry 300 is designed to allow for the rejection of unwanted signals by filtering them out. It is the effect that lightning has on the atmosphere that the LPDAD 10 is sensitive to. The processing of these signals is performed by the pilot voltage control circuitry 350 in one of several ways.

The pilot voltage control circuitry 350 may analyze the signals by analog comparator circuitry as shown in FIG. 2. In an alternate embodiment, a Digital Analog Converter (DAC) 352 with binary up/down counters 353 as shown in FIG. 4 may be employed. Further, a microcontroller 351 may be utilized, as shown in FIG. 5. Additionally, the microcontroller 352 may be used in conjunction with the analog comparators. The microcontroller 351 uses a pre-set voltage value in firmware to automatically present the voltage reference level at around an equilibrium point.

The LPDAD 10 has two levels of lightning alarm conditions, in the preferred embodiment. For the first level, a flashing strobe light 105 indicates that active lightning is within a range of 25 to 300 miles radius, more or less, as adjusted in the field. This range may vary depending on several variables, including but not limited to, the sensor electronics 300 and coupling of the ICPS 100. For the second level of alarm, a flashing strobe light 105 and audible alarm 140 indicates that a local lightning strike is highly likely in the immediate area.

In the non-microcontroller embodiment of the LPDAD 10 (e.g., FIGS. 2-4), four fixed CMOS 555 timers 312a–d are used to create the timing of the alarm indications. Two of the timers 312 are used for timing the duration of each of the two alarm indicators (strobe 105 and siren 140) at a designated time. In a preferred embodiment, this time is set at about 2 minutes for lightning detection before reset and twelve seconds for audible lightning prediction alarm.

However, it is understood by those of ordinary skill in the art that this time may vary. A third timer is used to inhibit the siren 140 for about 2 minutes from recurring within the 2 minute time-out. The fourth timer is used for the visible flashing LED lamp 400 and to indicate normal operation in an automatic tracking mode. However, in normal operation, flashing LED lamp 400 will only flash when alarm timers 312a–d are armed and working and in active signal standby as the LDPAD 10 will stay in an off-standby mode if it has just been turned on by the atmospheric acquisition sensory circuit 149. This delay may be about 2 minutes allowing the LPDAD 10 to stabilize the pilot voltage delivered to the ICPS 100.

The LPDAD 10 also includes an automatic nighttime shut-off mechanism as a part of circuit 149 which can be used to shut down the LPDAD 10 at night. This mechanism employs the use of a temperature sensor 148 as well as a solar panel 120. Temperature sensor 148 is used to detect temperatures which preclude the possibility of a lightning storm. Solar panel 120 is equipped with solar cells 125 for receiving photonic energy from the sun's radiation. This energy is then stored in an on-site battery compartment 128. Battery compartment 128 may consist of a series of batteries adapted to store electrical energy for reserve power needs.

Since other modifications and changes varied to fit a particular operating requirements and environment will be apparent to those skilled in the art, the invention is not considered limited to the example chosen for purposes of disclosure, and covers all changes and modifications which do not constitute a departure from the true spirit and scope of the invention.

Having thus described the invention, what is desired to be protected by Letters Patent is presented in the subsequent appended claims.

What is claimed is:

1. A system for detecting electrostatic electrical activity in the atmosphere and determining the presence of lightning activity, said system comprising:

ion sensing means for detecting molecular ionic changes in the atmosphere, static charge level logic control means for maintaining nominal static voltage values and detecting rapid changes in bias levels indicating electrical turbulence sensed by said ion sensing means, means for coupling the ion sensing means to said static charge level logic control means, modulating means for modulating received atmospheric voltage, multi-level alarm signaling means for signaling the presence of electrical activity in the atmosphere indicative of lightning presence, signal comparator means for selecting valid input signal level standards of lighting activity, on-site power means for providing electrical power to said multi-level alarm means.

2. The system for detecting electrostatic electrical activity in the atmosphere and determining the presence of lightning activity, as in claim 1, further comprising means for buffering said modulating means, said means for buffering being an insulator and being adapted to electrically protect said modulating means by forming a short circuit switch when a voltage above a predetermined threshold level is sensed by the ion sensing means.

3. The system for detecting electrostatic electrical activity in the atmosphere and determining the presence of lightning activity, as in claim 2, further comprising filtering means for filtering AC and RF interference signals entering the system.

4. The system for detecting electrostatic electrical activity in the atmosphere and determining the presence of lightning activity, as in claim 3, further comprising solar cell means for receiving solar energy for storage into said on-site power means.

5. The system for detecting electrostatic electrical activity in the atmosphere and determining the presence of lightning activity, as in claim 4, further comprising atmospheric acquisition sensory circuitry for real-time sensing of atmospheric parameters in the vicinity of the system.

6. The system for detecting electrostatic electrical activity in the atmosphere and determining the presence of lightning activity, as in claim 5, wherein said atmospheric acquisition sensory circuitry further comprises temperature sensing means for gauging atmospheric temperature and a photocell device for receiving photonic energy from the atmosphere; and said atmospheric acquisition sensory circuitry configured to shut the system down after detecting temperatures and photonic energy precluding lightning activity in the atmosphere.

7. The system for detecting electrostatic electrical activity in the atmosphere and determining the presence of lightning activity, as in claim 6, wherein said signal comparator means comprises a four-channel analog comparator coupled to a series of potentiometer devices, said potentiometer devices having preset voltage values at a predetermined value.

8. The system for detecting electrostatic electrical activity in the atmosphere and determining the presence of lightning activity, as in claim 7, wherein said static charge level logic control means comprises solely analog circuitry for maintaining and detecting static voltage values.

9. The system for detecting electrostatic electrical activity in the atmosphere and determining the presence of lightning activity, as in claim 8, further comprising a microcontroller, said microcontroller assisting in maintaining and detecting static voltage values.

10. The system for detecting electrostatic electrical activity in the atmosphere and determining the presence of lightning activity, as in claim 9, wherein said microcontroller is configured to activate and deactivate visual and audio alarms at predetermined time values.

11. The system for detecting electrostatic electrical activity in the atmosphere and determining the presence of lightning activity, as in claim 7, wherein said static charge level logic control means comprises digital to analog conversion circuitry for maintaining and detecting static voltage values.

12. The system for detecting electrostatic electrical activity in the atmosphere and determining the presence of lightning activity, as in claim 11, further comprising a microcontroller, said microcontroller assisting in maintaining and detecting static voltage values.

13. The system for detecting electrostatic electrical activity in the atmosphere and determining the presence of lightning activity, as in claim 7, wherein said multi-level alarm signaling means is configured to provide:

a visual alarm at a first level of lightning detection, an audio alarm at a second level of lightning detection, and both a visual and audio alarm at a third level of lightning detection.

14. The system for detecting electrostatic electrical activity in the atmosphere and determining the presence of lightning activity, as in claim 13, wherein said multi-level alarm signaling means comprises circuitry configured to activate and deactivate said visual and audio alarms at predetermined time values.

15. The system for detecting electrostatic electrical activity in the atmosphere and determining the presence of lightning activity, as in claim 7, wherein said means for coupling the ion sensing means to said static charge level logic control means is a resistive coupler.

16. The system for detecting electrostatic electrical activity in the atmosphere and determining the presence of lightning activity, as in claim 15, wherein said resistive coupler is a high impedance mega ohm resistor.

17. The system for detecting electrostatic electrical activity in the atmosphere and determining the presence of lightning activity, as in claim 7, wherein
said means for coupling the ion sensing means to said static charge level logic control means is a capacitive coupler.

18. The system for detecting electrostatic electrical activity in the atmosphere and determining the presence of lightning activity, as in claim 7, wherein said modulating means comprises an N channel MOSFET device.

19. The system for detecting electrostatic electrical activity in the atmosphere and determining the presence of lightning activity, as in claim 7, wherein said means for buffering comprises a gas lamp.

20. The system for detecting electrostatic electrical activity in the atmosphere and determining the presence of lightning activity, as in claim 19, wherein said gas lamp is a neon lamp.

* * * * *